US007545843B2

(12) United States Patent
Armani et al.

(10) Patent No.: US 7,545,843 B2
(45) Date of Patent: Jun. 9, 2009

(54) ULTRA-HIGH Q MICRO-RESONATOR AND METHOD OF FABRICATION

(75) Inventors: Deniz K. Armani, Burbank, CA (US);
Tobias J. Kippenberg, Bremen (DE);
Sean M. Spillane, Pasadena, CA (US);
Kerry J. Vahala, San Gabriel, CA (US)

(73) Assignee: California Institute of Technology, Pasadena, CA (US)

( * ) Notice: Subject to any disclaimer, the term of this patent is extended or adjusted under 35 U.S.C. 154(b) by 775 days.

(21) Appl. No.: 10/678,354

(22) Filed: Oct. 2, 2003

(65) Prior Publication Data

US 2004/0179573 A1    Sep. 16, 2004

Related U.S. Application Data

(60) Provisional application No. 60/415,412, filed on Oct. 2, 2002.

(51) Int. Cl.
*H01S 3/08* (2006.01)
(52) U.S. Cl. ............................ 372/92; 372/94; 372/67; 372/19
(58) Field of Classification Search ............... 372/19, 372/67, 92, 94
See application file for complete search history.

(56) References Cited

U.S. PATENT DOCUMENTS

| | | | |
|---|---|---|---|
| 3,589,794 A | 6/1971 | Marcatili | |
| 3,760,297 A | 9/1973 | Thompson | |
| 3,913,126 A | 10/1975 | Hooker et al. | |
| 4,282,499 A | 8/1981 | DeFonzo | |
| 4,695,121 A | 9/1987 | Mahapatra et al. | |
| 5,343,490 A * | 8/1994 | McCall | 372/94 |
| 5,651,022 A | 7/1997 | Anthon et al. | |
| 5,825,799 A | 10/1998 | Ho et al. | |
| 5,878,070 A | 3/1999 | Ho et al. | |
| 6,052,495 A | 4/2000 | Little et al. | |
| 6,078,605 A | 6/2000 | Little et al. | |
| 6,101,300 A | 8/2000 | Fan et al. | |
| 6,222,964 B1 | 4/2001 | Sadot et al. | |
| 6,259,717 B1 * | 7/2001 | Stone et al. | 372/92 |

(Continued)

FOREIGN PATENT DOCUMENTS

FR    2 703 473    10/1994

(Continued)

OTHER PUBLICATIONS

D. Y. Chu, Obsersvation of Enhanced Photoluminescence In Erbium Doped Semiconductor Microdisk Resonator, May 22, 1995, Applied Physics Letters, vol. 66, p. 2843-2845.*

(Continued)

*Primary Examiner*—Minsun Harvey
*Assistant Examiner*—Tod T Van Roy
(74) *Attorney, Agent, or Firm*—Connolly Bove Lodge & Hutz LLP

(57) ABSTRACT

A micro-cavity resonator including a micro-cavity capable of high and ultra-high Q values and a silicon substrate. Portions of the silicon substrate located below a periphery of the micro-cavity are removed to form a pillar, which supports the micro-cavity. Optical energy travels along an inner surface of the micro-cavity.

57 Claims, 12 Drawing Sheets

U.S. PATENT DOCUMENTS

| | | | |
|---|---|---|---|
| 6,901,101 | B2 | 5/2005 | Frick |
| 2001/0033587 | A1 | 10/2001 | Vahala et al. |
| 2002/0018611 | A1* | 2/2002 | Maleki et al. ............... 385/15 |
| 2002/0080842 | A1* | 6/2002 | An et al. ...................... 372/92 |
| 2003/0021518 | A1 | 1/2003 | Simirnov et al. |
| 2003/0179981 | A1 | 9/2003 | Lee et al. |

FOREIGN PATENT DOCUMENTS

| | | |
|---|---|---|
| JP | 05203826 A | 8/1993 |
| WO | WO 98/05995 | 2/1998 |

OTHER PUBLICATIONS

Gayral, B., et al., High-Q wet-etched GaAs microdisks containing InAs quantum boxes. Applied Physics Letters, vol. 75, No. 13, p. 1908-1910 (1 999).*

Karachi M: Silica Waveguides on Silicon and Their Application to Integrated- Optic Component, Optical and Quantum Electronics, Chafman and Hall, London, G8vol. 22, Jan. 1996 (1990-01), pp. 391-416.*

Klitzic: V., Loncor R, Ilchenko V S, hare J, Lefe/ze-Seguin V: Tunable Whispering gallery modes for spectroscopy and CQED experiments New Journal of Physics, vol. 3, No. 14, Aug. 3, 2001, pp. 1-14.*

Isaac W.T. Chan, Gas Phase Pulse Etching of Silicon For MEMS With Xenon Difluoride, 1999, IEEE, 0-7803-5579, p. 1637.*

Chu D., et al, Observation of Enhanced Photoluminescence in Erbium-Doped Semiconductor Microdisk Resonator. *Applied Physics Letters* 66 (21), p. 2843-2845 (1995).

Kawachi, M., Silica Waveguides on Silicon and Their Application to Integrated-Optic Components. *Optical and Quantum Electronics* 22, p. 291-416 (1990).

Von Klitzing, W. et al., Tunable Whispering Gallery Modes for Spectroscopy and CQED Experiments. *New Journal of Physics* 3, p. 14.1-14.4 (2001).

International Search Report in PCT App. No. US03/31727, mailed Mar. 26, 2005.

Armani, D., et al., Ultra-high-Q toroid microcavity on a chip. *Nature*, vol. 421, p. 925-927 (2003).

Chin, M., et al., Design and Modeling of Waveguide-Coupled Single-Mode Micoring Resonators. *Journal of Lightwave Technology*, vol. 1, No. 8, p. 1433-1446 (1998).

Gerard, J.M., et al. "Quantum boxes as active probes for photonic microstructures: The pillar microcavity case" *Applied Physics Letters* 69, 449-451 (1996).

Gorodetsky, M. L., et al. "Ultimate Q of optical microsphere resonators" *Optics Letters* 21, 453-455 (1996).

Vemooy, D. W., et al. "High-Q measurements of fused-silica microspheres in the near infrared" *Optics Letters* 23, 247-249 (1998).

Cai, M., et al., "Observation of critical coupling in a fiber taper to a silica- microsphere whispering-gallery mode system" *Physical Review Letters* 85, 74-77 (2000).

Spillane, S. M., et al., "Ultralow-threshold Raman laser using a spherical dielectric microcavity" *Nature* 415, 621-623 (2002).

Gayral, B. et al., "High-Q wet-etched GaAs microdisks containing InAs quantum boxes" *Applied Physics Letters* 75, 1908-1910 (1999).

Michler, P. et al., "Quantum dot lasers using high-Q microdisk cavities" *Physica Status Solidi B-Basic Research* 224, 797-801 (2001).

Cai, M., et al., "Fiber-coupled microsphere laser" *Optics Letters* 25, 1430-1432 (2000).

McCall, S. L., et al., "Whispering-Gallery Mode Microdisk Lasers" *Applied Physics Letters* 60, 289-291 (1992).

Sandoghdar, V., et al., "Very low threshold whispering-gallery-mode microsphere laser" *Physical Review A* 54, R1777-R1780 (1996).

Djordjev, K., et al., "Microdisk tunable resonant filters and switches" *Ieee Photonics Technology Letters* 14, 828-830 (2002).

Rabiei Payam, W. H. S., et al., "Polymer Micro-Ring Filters and Modulators" *Journal of Lightwave Technology* 20, 1968-1975 (2002).

Djordjev, K., Choi, et al., "Vertically coupled InP microdisk switching devices with electroabsorptive active regions" *Ieee Photonics Technology Letters* 14, 1115-1117 (2002).

Yariv, A. "Critical coupling and its control in optical waveguide-ring resonator systems" *Ieee Photonics Technology Letters* 14, 483-485 (2002).

Soref, R. A., et al., "Proposed N-wavelength M-fiber WDM crossconnect switch using active microring resonators" *Ieee Photonics Technology Letters* 10, 1121-1123 (1998).

Chu, S. T., et al., "An eight-channel add-drop filter using vertically coupled microring resonators over a cross grid" *Ieee Photonics Technology Letters* 11, 691-693 (1999).

Little, B. E., et al., "Vertically coupled glass microring resonator channel dropping filters" *Ieee Photonics Technology Letters* 11, 215-217 (1999).

Offrein, B. J., et al.., "Resonant coupler-based tunable add-after-drop filter in silicon-oxynitride technology for WDM networks" *Ieee Journal of Selected Topics in Quantum Electronics* 5, 1400-1406 (1999).

Little, B. E., et al., "Microring resonator channel dropping filters" *Journal of Lightwave Technology* 15, 998-1005 (1997).

Grover, R., et al., "Parallel-cascaded semiconductor microring resonators for high- order and wide-FSR filters" *Journal of Lightwave Technology* 20, 872-877 (2002).

Yanagase, Y., et al., "Box-like filter response and expansion of FSR by a vertically triple coupled microring resonator filter" *Journal of Lightwave Technology* 20, 1525-1529 (2002).

Krioukov, E., et al., "Sensor based on an integrated optical microcavity" *Optics Letters* 27, 512-514 (2002).

Vollmer, F., et al., "Protein detection by optical shift of a resonant microcavity" May 2002.

Bumki, M., et al., "Compact, fiber-compatible, cascaded Raman laser" *Optics Letters,* vol. 28, No. 17, Sep. 2003.

Kleppner, D., "Inhibited Spontaneous Emission" *Physical Review Letters* 47, 233-236 (1981).

Yang, L., et al., "Fiber-coupled Erbium Microlasers on a chip" *Applied Physics Letters*, vol. 83, No. 5, 825-826, Aug. 2003.

Kippenberg, S. M., et al., "Fabrication and coupling to planar high-Q silica disk microcavities" *Applied Physics Letters*, vol. 83, No. 4, 797-799, Jul. 2003.

Yang, L., et al., "Gain functionalization of silica microresonators" Apr. 2003.

Schiller, S., et al., "Fused-silica monolithic total-internal-reflection resonator" *Optics Letters*, vol. 17, No. 5, 378-380 Mar. 1992.

Knight, J.C., "Phase-matched excitation of whispering-gallery-mode resonances by a fiber taper" *Optics Letters*, vol. 22, No. 15, 1129-131 Aug. 1997.

Yariv, A., "Universal relations for coupling of optical power between microresonators and dielectric waveguides" *Electronics Letters*, vol. 36, No. 4, 321-322 Feb. 2000.

Little, B.E., et al., "Wavelength Switching and Routing Using Absorption and Resonance" *IEEE Photonics Technology Letters*, vol. 10, No. 6, 816-818 Jun. 1998.

* cited by examiner

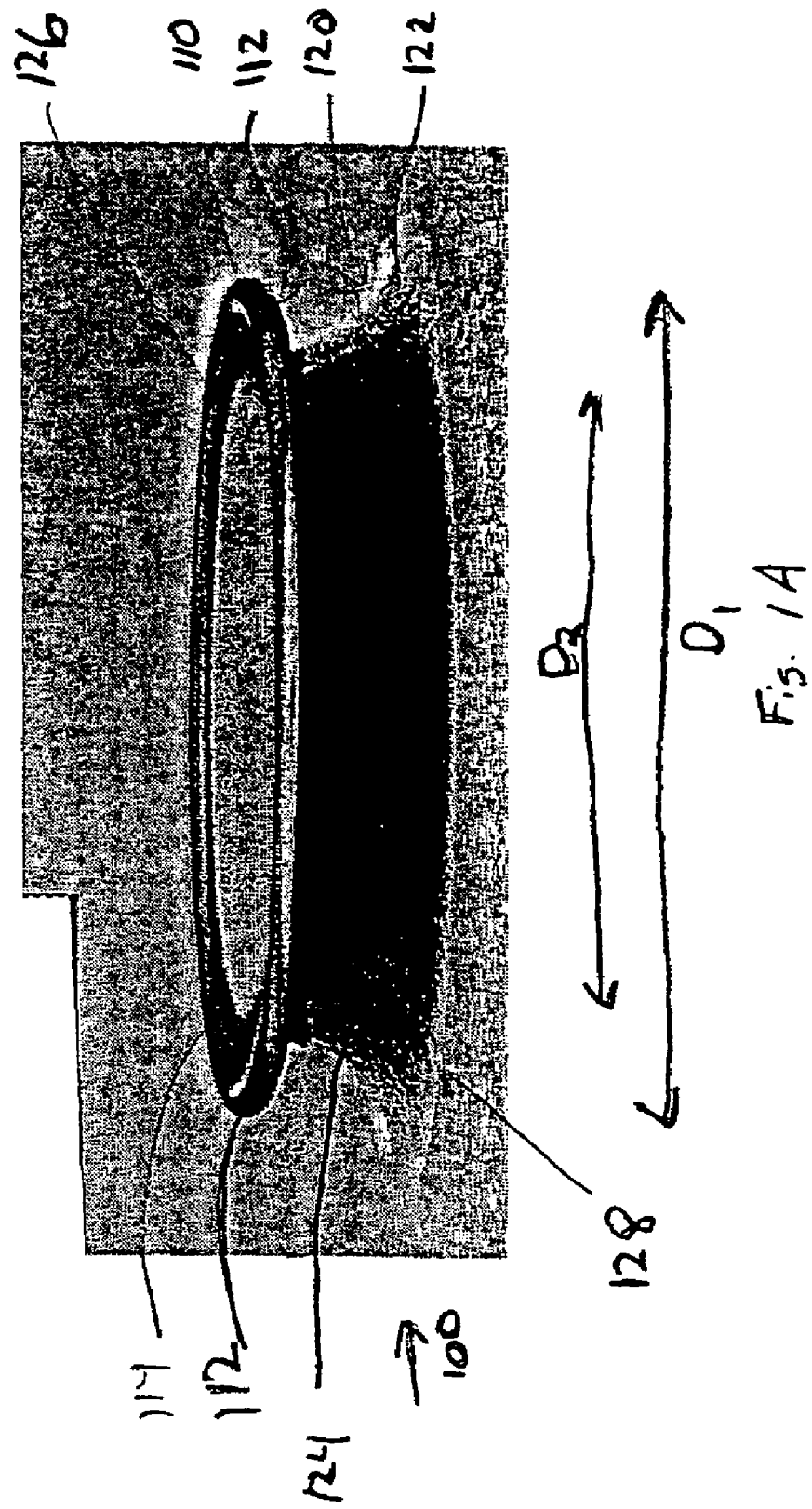

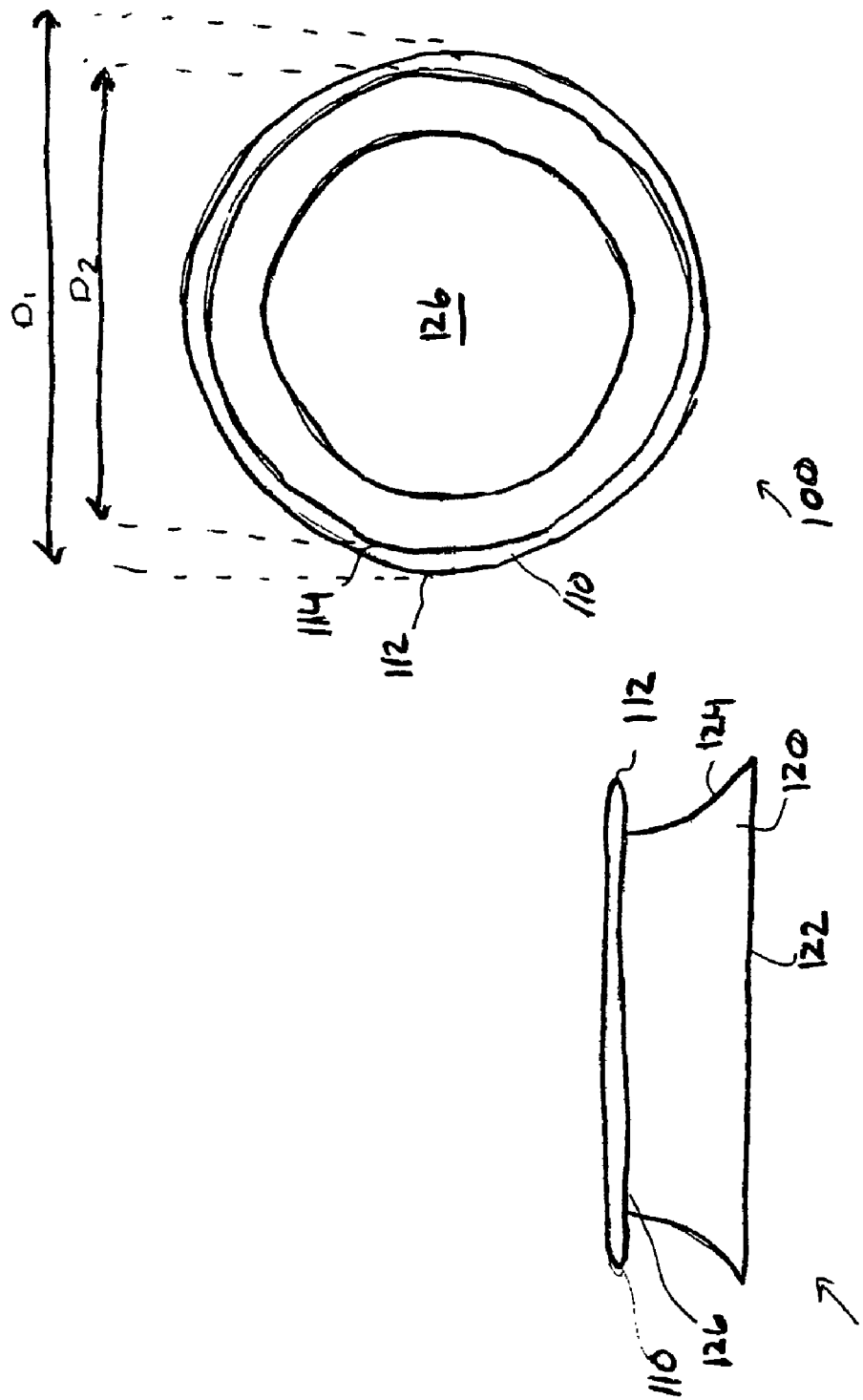

(w/o taper guide)

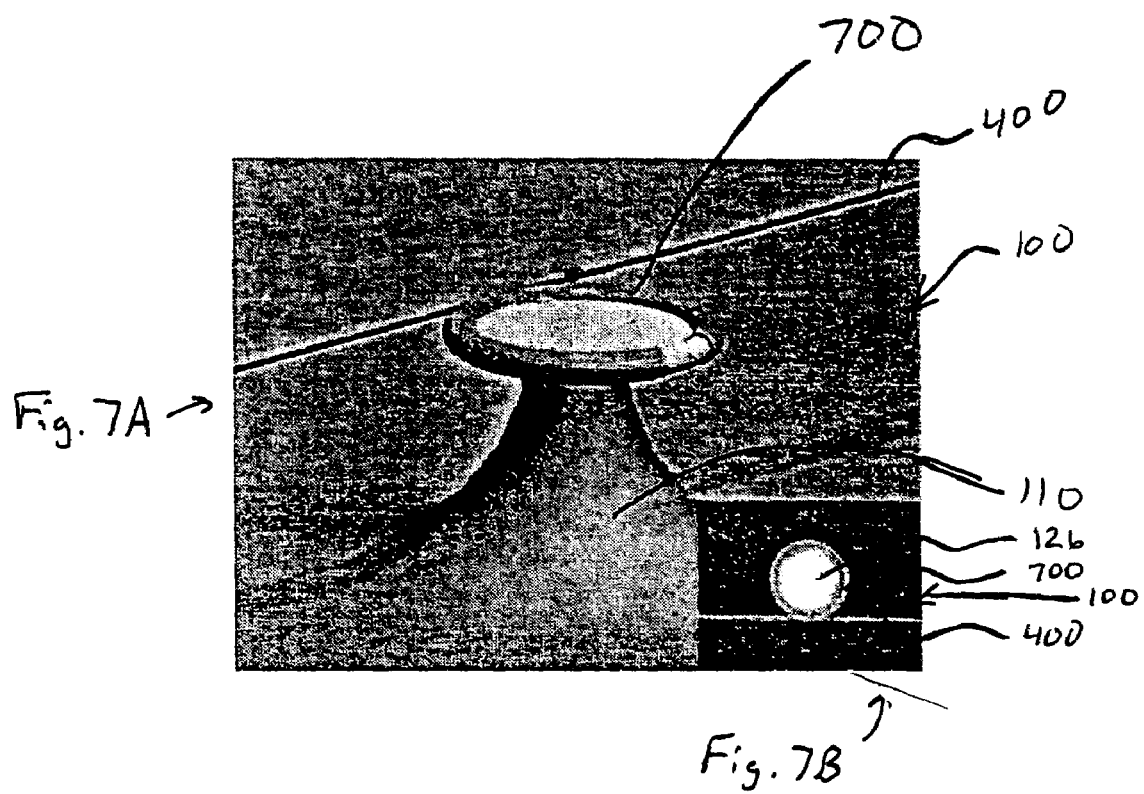

US 7,545,843 B2

ULTRA-HIGH Q MICRO-RESONATOR AND METHOD OF FABRICATION

CROSS-REFERENCE TO RELATED APPLICATION

This application claims priority under 35 U.S.C. §119 to U.S. Provisional Patent Application No. 60/415,412, filed Oct. 2, 2002, the entire disclosure of which is incorporated herein by reference.

STATEMENT REGARDING FEDERALLY SPONSORED RESEARCH

The U.S. Government has certain rights in this invention pursuant to Grant No. N00014-00-1-0650 awarded by the Office of Naval Research.

FIELD OF THE INVENTION

The present invention is directed to micro-cavity resonators, more particularly, ultra-high-Q micro-cavity resonators.

BACKGROUND OF THE INVENTION

Various micro-cavity resonators have been utilized to re-circulate light and store optical power. In a typical micro-cavity resonator, light traverses around an interior surface of the cavity. The optical power stored in the resonator can be used in cavity quantum electrodynamics (cQED), photonics, and various optics applications. The surface quality or finish usually affects how long light can re-circulate in the resonator. For example, known high-Q micro-cavities include surface-tension induced micro-cavities (STIM), such as droplets or micro-spheres. STIM micro-spheres typically have smooth surfaces that allow light energy to be stored for longer periods of time and provide a high Q factor or Q value.

The "Q factor" or "Q value" measures the stability of light within a resonator. In other words, the Q value measures the relationship between stored energy and the rate of dissipation of the energy. For example, known STIMs or spherical micro-cavities can have Q factors that approach 10 billion, i.e., they can store light energy for 10 billion light cycles. Micro-cavities having higher Q factors can store light energy for longer periods of time compared to micro-cavities having lower Q factors. Micro-cavities with higher Q factors are also typically more sensitive compared to lower Q factor cavities. Thus, micro-cavities having higher Q factor values are generally preferred since they maintain light energy for longer periods of time and can be used in a broader range of applications. For purposes of explanation and to establish a point of reference, a "high" Q value is generally defined as a Q value up to about one million or $10^6$, and an "ultra-high" Q value is generally defined as a Q value greater than a million.

Applications of known high Q spherical and droplet STIM micro-cavities, however, are typically limited to laboratory applications and experiments as a result of their spherical shape and the fabrication controls that are needed to produce a spherical shape.

Thus, known micro-cavity resonators capable of high or ultra-high Q values and the manner in which they are fabricated can be improved. The typical tradeoff between Q value and integration and control should be eliminated or mitigated. More specifically, of micro-resonators should be capable of "high" and "ultra" "high" Q values to "ultra high" Q values while, at the same time, being fabricated with traditional wafer-based processing techniques and equipment. Moreover, micro-cavities capable of ultra-high Q values should be fabricated in a time and cost efficient manner with known wafer processing techniques. Ultra-high Q micro-resonators should also be of a form that is more easily adaptable and compatible with other planar circuits and standard microelectronics fabrication techniques for integration and production with other Thus, there exists a need for a high Q and ultra-high Q micro-resonator that can be fabricated on a larger scale in a controllable and reliable manner, for example by using known wafer processing techniques.

SUMMARY OF THE INVENTION

In one embodiment, a micro-cavity resonator includes a micro-cavity and a substrate. Portions of the substrate that are located below the micro-cavity are removed to form a pillar, which supports the micro-cavity. Optical energy travels along an inner surface of the micro-cavity.

Also in accordance with the present invention is an ultra-high Q micro-cavity resonator that includes an optical material and a substrate. The substrate supports the optical material. The optical material may be heated or melted by a heat source so that a periphery of the optical material adheres to itself to form an ultra-high Q micro-cavity. Optical energy travels along an inner surface of the ultra-high Q micro-cavity.

In yet further accordance with the present invention, a planar micro-cavity includes a toroid-shaped planar silica micro-cavity and a silicon substrate. Portions of the substrate that are located below a periphery of the micro-cavity are isotropically etched to form a silicon pillar that supports the micro-cavity. Light energy traverses along an inner surface of the micro-cavity.

Also in accordance with the present invention is a method of forming a micro-cavity. The method includes providing a substrate and an optical material, such as silica, coating the substrate with silicon dioxide, etching the substrate (e.g., isotropically with a xenon difluoride gas) to form a pillar that supports the optical material, and heating a periphery of the optical material so that the periphery melts and adheres to itself. The periphery may be heated or melted with a laser, such as an Excimer or $CO_2$ laser. For example, the diameter of the optical material may decrease as it is heated until the molten optical material collapses after which the diameter remains substantially constant. The melted periphery forms a micro-cavity. Optical energy travels along an inner surface of the micro-cavity.

In various embodiments, the micro-cavity may have various shapes, configurations and materials. For example, they can be planar and have toroid and elliptical shapes. The cavity may be made of silica or a glass material that has a melting point that is lower-than a melting point of the substrate. The micro-cavity may also be prepared so that it is substantially parallel to a top surface of the pillar, although the invention is not so limited and other orientations and configurations may be utilized. The substrate may be, for example, a silicon substrate. Further, optical energy within the micro-cavity may be resonant in a whispering-gallery mode (WGM).

Also in accordance with the present invention, an etchant may be used to remove portions of the substrate underneath the micro-cavity. For example, the etchant may be a xenon difluoride ($XeF_2$) gas that isotropically etches the substrate to form the pillar.

In yet further accordance with the present invention, the micro-cavity may include a surface treatment or dopant. For example, they can be doped with a rare Earth dopant, such as erbium, ytterbium, or neodymium, have an optically active component, a biologically active substance, and have a biotinlynated surface. A sol-gel coating, such as an erbium-doped sol-gel coating, can be applied to the micro-cavity.

The micro-cavity is capable of both "high" and "ultra-high" Q values. For example, the micro-cavity can have Q values exceeding one million.

BRIEF DESCRIPTION OF THE DRAWINGS

Referring now to the drawings, in which like reference numbers represent corresponding parts throughout, and in which:

FIGS. 1A is a perspective view of a micro-cavity according to an embodiment of the present invention; FIG. 1B is a side view of a micro-cavity according to an embodiment of the present invention; FIG. 1C is a top view of a micro-cavity according to an embodiment of the present invention;

FIGS. 7A is a perspective view of a fiber-taper waveguide coupled to the coated micro-cavity, and FIG. 7B is a top view of a fiber-taper waveguide coupled to the coated micro-cavity.

DETAILED DESCRIPTION OF PREFERRED EMBODIMENTS

Figure 2:
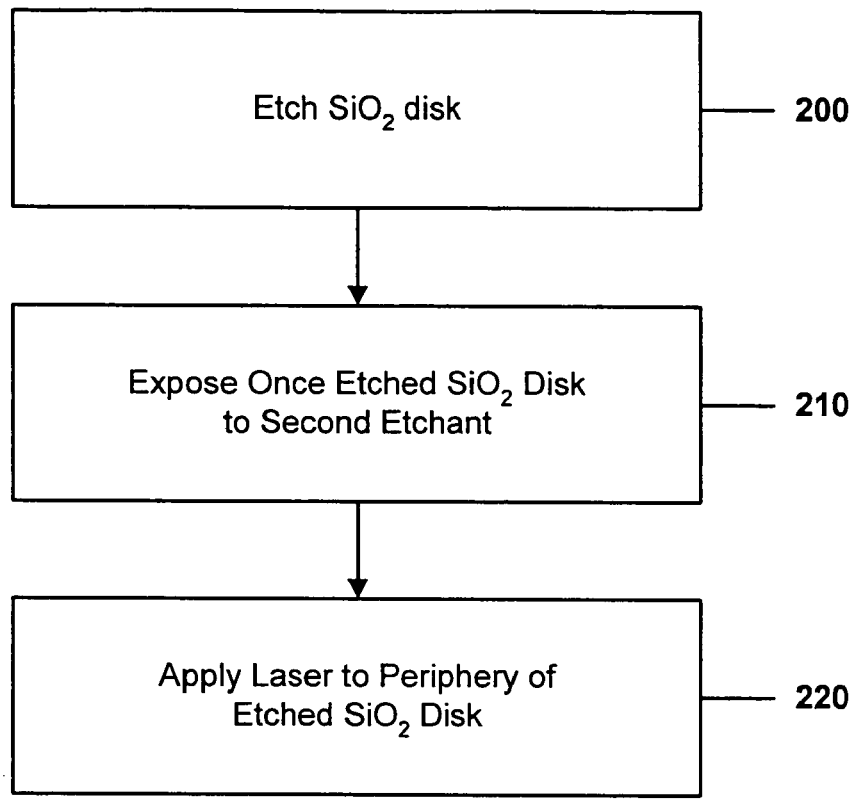
FIG. 2 is a system flow diagram illustrating a method of fabricating a micro-cavity according to the present invention.

Embodiments of a micro-cavity resonator capable of ultra-high Q values and a method for fabricating an ultra-high Q micro-cavity resonator, will now be described. The described micro-cavity and method provide ultra-high Q values that can be fabricated using known semiconductor and wafer processing techniques and equipment. Thus, the micro-cavities of the present invention can be fabricated in a time and cost effective manner and can also be integrated with other planar components and systems that are produced with planar fabrication techniques and equipment. In the following description, reference is made to the accompanying drawings, which show by way of illustration specific embodiments in which the invention may be practiced. It is to be understood that other embodiments may be utilized as various changes may be made without departing from the scope of the invention.

Referring to FIGS. 1A-C, in accordance with one aspect of the present invention, are embodiments of an ultra-high Q micro-cavity assembly 100 includes an optical material or micro-cavity 110 and a substrate 120. In the illustrated embodiment, the micro-cavity 110 is in the form of a ring, disk or toroid has a periphery or outer edge 112 and an inner edge 114. An outer diameter D1 is defined by the outer edges 114, and an inner diameter D2 is defined by the inner edges 112. The micro-cavity can be, for example, a silica micro-cavity. The substrate can be, for example, a silicon substrate.

The substrate 120 includes a bottom surface 122, a middle tapered or angled surface 124, and a top surface 126. Portions of the silicon substrate 120 that are located below the micro-resonator 110, e.g., below a periphery 112 of the micro-resonator 110, are removed so that the substrate 120 is in a form of a support pillar. In the illustrated embodiment, the inner edge 114 of the micro-cavity extends around the outer edge of the top surface 126 of the substrate. Thus, the substrate 120 effectively supports and elevates the micro-cavity 110 above the bottom surface 122 of the substrate. In the illustrated embodiment, the ultra-high Q micro-cavity 110 is substantially parallel to a top surface 126 of the pillar. Other non-parallel orientations may also be utilized. Optical energy travels along an inner surface of the outer edge 112 of the ultra-high Q micro-cavity 110, for example, within a whispering gallery mode (WGM) or other resonant modes as needed. A WGM is a resonate mode in which optical energy electromagnetic waves are totally internally reflected, and focused by the inner surface of the micro-cavity. Thus, the optical energy can circulate within the micro-cavity and be confined therein to provide high and ultra-high Q values.

Various factors can influence the Q value of the micro-cavity resonation. For example, different optical materials and surface finishes can support different Q values. Q values can also change based upon the diameter of the micro-cavity. For example, in one embodiment, the diameter of a silica micro-cavity can be from about 10 μm to about 500 μm, preferably between 15 μm to about 200 μm and the corresponding Q values can range from about $10^4$ to about $10^9$. In one embodiment, the ultra-high Q micro-cavity has a diameter of at least about 10 micrometers, e.g., between about 10 and about 30 micrometers, and a Q value of about 500 million. Accordingly, persons of ordinary skill in the art will recognize that the size of the micro-cavity is one factor in providing an ultra-high Q value, and that the present invention is capable of supporting optical energy at various Q values including "high" Q values and even higher Q values, such as "ultra-high" Q values. Persons of ordinary skill in the art will also recognize that the present invention is capable of achieving various ultra-high Q values, e.g., at least $10^6$ or one million. For example, in one embodiment, the Q value may be about $10^8$ or 100 million to about $5 \times 10^8$ or 500 million. Further, persons of ordinary skill in the art will recognize that micro-cavities having different shapes and sizes can have various ultra-high Q values.

The micro-cavity 110 of the present invention is capable of providing both high and ultra-high Q values as previously defined. This specification, however, refers to an ultra-high Q micro-cavity since micro-cavities having ultra-high Q values are generally preferred and may be utilized a broader range of applications. The invention, however, is not so limited and can be utilized with both high and ultra-high Q experiments, applications and components.

FIG. 2 illustrates a method of fabricating an ultra-high Q micro-cavity according to the present invention. Initially, in step 200, a silicon dioxide ($SiO_2$) disk or a circular pad is etched, for example, with a hydrogen fluoride (HF) solution. In step 210, the silicon dioxide disk is exposed to a second etchant, such as xenon difluoride ($XeF_2$) gas, which removes portions of the silicon base beneath the periphery of the silicon dioxide disk. Xenon difluoride is an etchant with high selectivity that is currently utilized to produce, for example, Micro Electrical Mechanical Systems (MEMS) devices. In step 220, a laser, such as an Excimer or $CO_2$ laser, is applied to the undercut periphery of the silicon dioxide disk. As a result of the laser illumination, the periphery portions of the disk are melted or partially or completely liquefied, and a toroid-shaped micro-cavity is formed, as shown in FIGS. 1A-C. It is believed that the molten silica collapses and adheres to itself due to the surface tension of silica.

Figure 3:
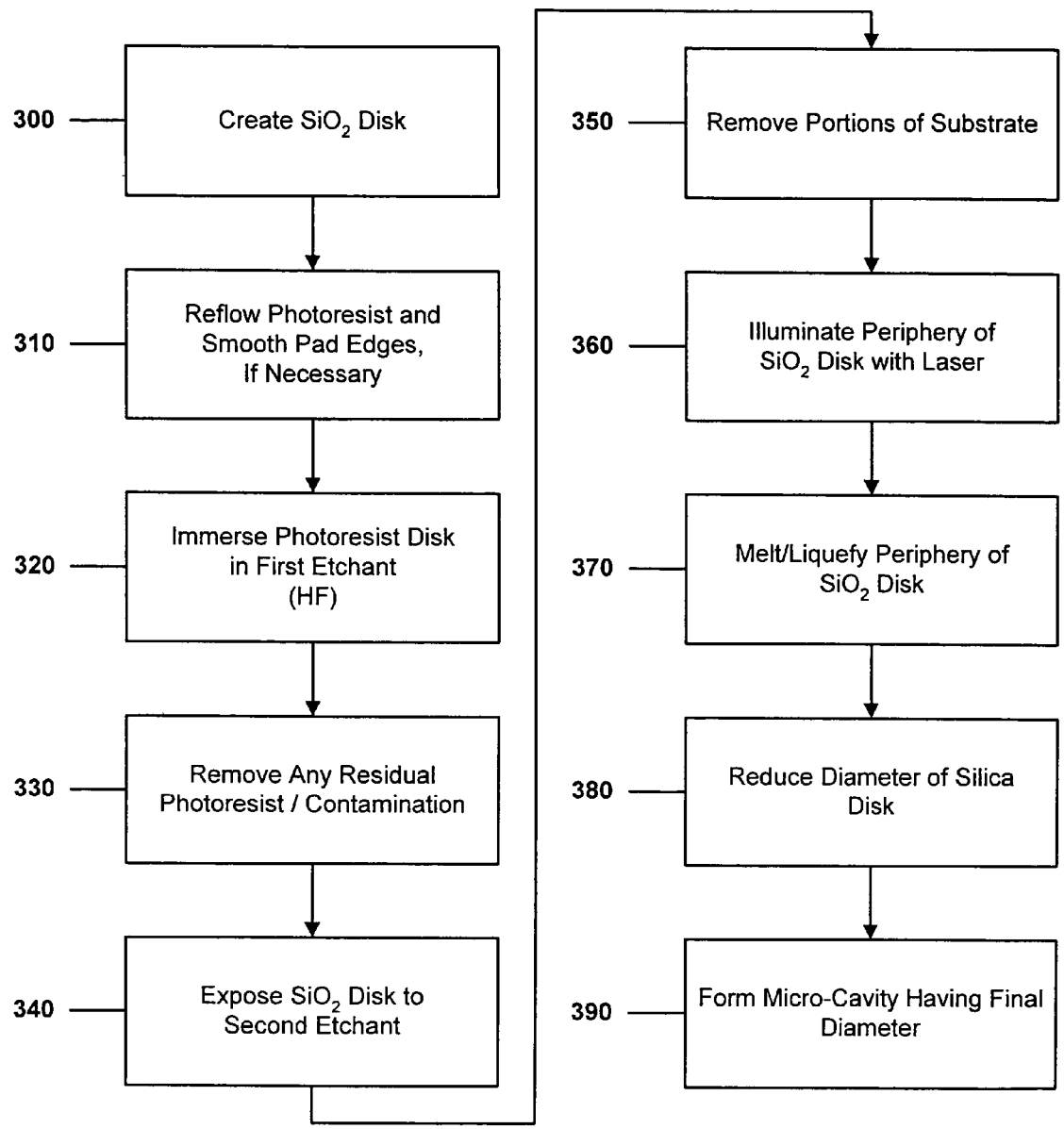
FIG. 3 is a flow chart illustrating more detailed processing steps to produce a micro-cavity according to the present invention.

FIG. 3 illustrates further details of the method of fabricating a micro-cavity. In one embodiment, an ultra-high Q silica micro-cavity is fabricated on a silicon substrate or wafer, preferably (100) prime grade silicon. The silicon substrate includes a thermal oxide layer having a thickness of, for example, about two micrometers or other suitable thicknesses as needed.

Persons of ordinary skill in the art will recognize that other substrates can also be used depending on the etchants utilized and the particular application. In step 300, known photolithography processing is used to create a disk-shaped photoresist pad on the silicon substrate within an oxide layer (silica or $SiO_2$ disk). The $SiO_2$ disk can have a diameter of from about 10 μm to about 500 μm, preferably about 20 μm to about 200 μm, even more preferably about 160 μm.

The photoresist can be heated again in step 310, if necessary, to reflow the photoresist and smooth the edges of the disk. In step 320, the silica disk is immersed in a first etchant, e.g., a hydrogen fluoride (HF) etch solution at room temperature. The silica disk acts as an etch mask when immersed in the HF solution. In step 330, residual photoresist and any organic contamination can be removed with acetone or another suitable removal agent.

Continuing with step 340, the silica disk is exposed to a second etchant, e.g., xenon difluoride ($XeF_2$) gas at a pressure of about 3 Torr. The silica disk acts as an etch mask during exposure to the $XeF_2$ gas. As a result, in step 350, portions of the silicon substrate are removed by the $XeF_2$ gas, and the remaining portions of the silicon substrate form a pillar, which supports the larger Silica disk above. The etchant used in step 340 is preferably a $XeF_2$ gas since it can selectively remove silicon. Specifically, the $XeF_2$ gas isotropically removes silicon so that the periphery of the silica disk is equally undercut, leaving a tapered silicon pillar or substrate that supports the larger silica disk. Thus, the outer edges of the $SiO_2$ disk extend around the outer portion of the top surface of the silicon pillar. Removing the higher index silicon from the silicon substrate also serves to inhibit power leakage from the micro-resonator into the silicon substrate.

At this point, whispering gallery modes (WGMs) can exist along the rim of the silica disk structure. For example, at this stage the disk can have Q values exceeding 260,000. For example, the Q value can reach levels of about 3.4 million. Q values of this magnitude within a resonant planar structure prepared on a silicon substrate may already surpass Q values of conventional planar resonators that are fabricated on the silicon substrates. The surface finish of the disk, however, can be processed further to provide a smoother surface finish that can support substantially higher Q values, e.g., ultra-high Q values. Specifically, the periphery of the silica disk can be melted and formed into a low loss, smooth surface, as described in the following steps 360-390.

In step 360, the periphery of the undercut silica disk is illuminated with a laser or other suitable radiation or heat source, such as a $CO_2$ laser that emits radiation at about 10.6 micrometers. The intensity profile of the $CO_2$ beam preferably follows an approximate Gaussian distribution and is focused to a diameter of approximately 200 microns. These $CO_2$ lasers are similar to lasers that are currently utilized in known before processing integrated circuit (IC) planarization. The intensity profile of the $CO_2$ beam preferably follows an approximate Gaussian distribution and is focused to a diameter of approximately 200 microns.

When the outer portions of the disk are sufficiently heated, in step 370, they melt or are partially or completely liquefied. The silica disk periphery melts due to the temperature dependence of the silica near the 10.6 micrometer laser wavelength and the thermal isolation of the undercut silica disk. As a result of the high surface tension of the silica, the molten silica overcomes the forces of gravity and adheres to itself so that the laser selectively reflows the undercut periphery of the silica disk. During the silica reflow, the $CO_2$ laser beam intensity can be varied as needed, but is typically about 100 $MW/m^2$.

In step 380, as the molten silica disk is heated with the laser, the diameter of the disk structure becomes smaller which, in turn, reduces the effective cross-section of the disk that is available to absorb power from the laser. As a result of the preceding steps, the molten silica shrinks and stabilizes into a toroid-like silica micro-cavity. The time required for the molten silica to assume the toroid-like shape can vary depending on, for example, the size of the disk and the amount and duration of laser radiation. For example, in one embodiment, the disk shrinks into the terminal toroid shape having a final diameter after laser radiation. Different durations of laser heating may be utilized depending on the particular materials and micro-cavity applications, e.g., about 1 microsecond to about 10 seconds of laser heating may be utilized. During laser heating, the silicon pillar remains significantly cooler and physically unaffected throughout the silica reflow process, serving as a heat sink to selectively absorb and dissipate the heat generated by the reflow process. This is due to silicon having a weaker optical absorption than silica at 10.6 microns. Silicon is also about 100 times more thermally conductive than silica.

The initial diameter of the $SiO_2$ disk can be, for example, from about 400 μm to about 1000 μm. The final or terminal outer diameter of the micro-cavity can be, for example, from about 10 μm to about 500 μm, preferably about 100 μm. The micro-cavity can have a thickness of about 1 μm to about 12 μm, preferably 4 μm. The final diameter of size of the micro-cavity can be limited by the size of the top surface of the silicon substrate. In other words, when needed the molten silica disk shrinks and collapses upon itself until the inner surface of the disk shrinks around the outer portion of the top surface of the silicon pillar. Thus, the micro-cavity is "self-quenching" when heated and assumes the shape of a toroid as a stable state. The final diameter of the micro-cavity can also be further controlled by additional lithography and chemical etch steps, as needed.

The resulting toroid-shaped micro-cavity has smoother surfaces with an improved surface finish compared to the silica disk before the laser reflow processing. For example, after the reflow processing, the toroid-shaped micro-cavity can have Q values exceeding one million (ultra-high Q values), whereas the Q value of the silica disk before the laser reflow processing was about 260,000 in this particular example.

In one embodiment, the surface finish of the toroid-shaped micro-cavity has a root mean square (rms) roughness of about several nanometers. These surface finishes are similar to surface finishes of micro-sphere resonators. However, the present invention, unlike known micro-sphere resonators, provides these surface finishes and ultra-high Q values in a planar micro-resonator that can be prepared on a silicon substrate using known wafer processing and component integrating techniques. Other characteristics and technical aspects of an ultra-high Q micro-cavity resonator according to the present invention are described in "Ultra-High-Q Toroid Microcavity on a Chip," Nature, vol. 421, no. 6926, pp. 925-928 (Feb. 27, 2003), the disclosure of which is incorporated herein by reference.

Having described embodiments of an ultra-high Q micro-cavity and a one manner of manufacturing a micro-cavity utilizing laser radiation to reflow of periphery of a silica disk, persons of ordinary skill in the art will recognize that various modifications to the previously described micro-resonator and fabrication method can be implemented to fabricate other micro-resonators capable of ultra-high Q values.

For example, instead of utilizing a silica disk or $SiO_2$, other optical materials can be utilized to produce an ultra-high Q micro-resonator. In an alternative embodiment, the optical material may be a low melting point glass that has a melting point that is lower than silica, which has a melting point of about 1983° F.±−100° F. Laser radiation can be applied to the low melting point glass to reflow the glass to form the micro-cavity. Further, both the low melting point glass and the substrate (e.g. silicon substrate) can be heated together without the use of a laser. In this embodiment, the temperature is controlled so that the glass melts before the silicon substrate. As a result, the silicon substrates maintains its integrity, and the glass is melted into the ultra-high Q micro-cavity and can assume a toroid shape, as previously discussed. Further, other suitable materials besides silica and low melting point glass can be utilized if they possess a relatively high surface adhesion that can overcome forces of gravity. In addition, other substrates besides a silicon substrate can be utilized, such as III-V substrates.

In the illustrated embodiment, the micro-cavity 110 has a generally circular or disk shape. For example, the micro-cavity shown in FIGS. 1A-C has a toroid or doughnut-like shape. Toroid dimensions may vary with the size of the micro-cavity. In one embodiment, the toroid has a thickness of about five to about ten μm. Upon reading this specification, persons of ordinary skill in the art will recognize that micro-cavity resonators can have other shapes besides a disk or toroid-like shapes including, but not limited to, an elliptical shape, an oval or "race track" shape, partially toroid, elliptical, oval and circular shapes, and various other irregular shapes by utilizing different materials, etchants, heating/reflow temperatures, durations. This specification, however, refers to and illustrates a toroid-shaped micro-cavity for purposes of explanation and illustration.

Further, different radiation sources and lasers that emit radiation at different emission wavelengths may be suitable for other optical materials including, but not limited to, Excimer lasers. Further, the laser can be applied to different portions of the periphery of the $SiO_2$ disk for different periods of time and patterns for various degrees of reflow or to produce micro-cavities of different shapes. For example, as previously discussed, the laser can be applied to the silica disk so that it reflows and adheres to itself and consistently shrinks to its terminal diameter. The laser, however, can also be applied to the silica disk for smaller amounts of time. In these instances, the diameter of the silica micro-resonator would be smaller than the initial diameter, but larger than the terminal diameter. In yet a further alternative embodiment, once heating of the silica disk has begun, the reflow process can be interrupted prior to quenching of the silica disk and forming of a toroid shape. In this instance, the micro-resonator would also have a smaller diameter than the terminal toroid diameter.

The laser or other heat source can also be applied to selected sections of the silica disk for different amounts of time to produce micro-resonators with different shapes and sizes. As a result, only the heated sections may become smaller, thereby resulting in an elliptical or irregularly shaped micro-cavities. Accordingly, the toroid shape having a terminal diameter is merely illustrative of a preferred ultra-high Q micro-cavity. The invention, however, is not so limited.

Figure 4A:
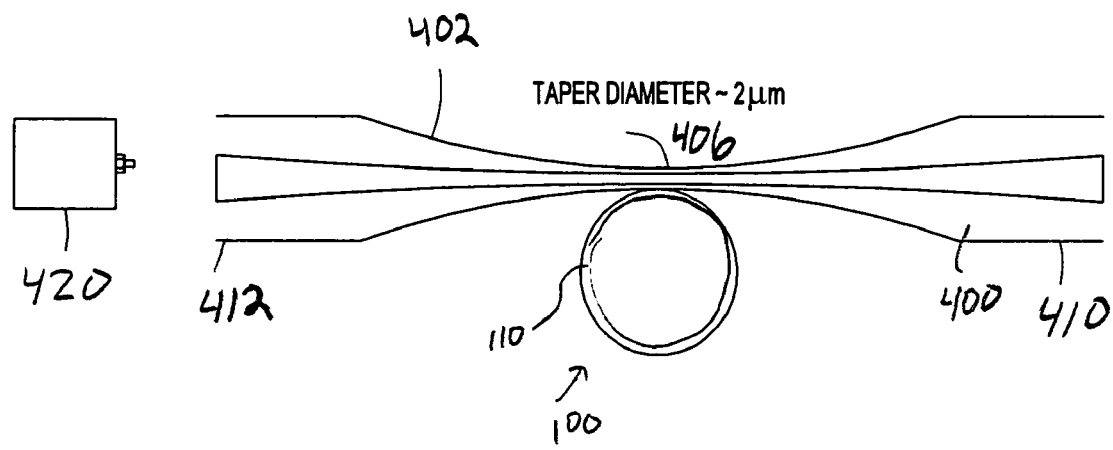
FIG. 4A is a schematic view of a fiber taper coupler or waveguide in contact with a micro-cavity.

One manner in which light stored in an ultra-high Q micro-cavity resonator is coupled to a transmission media, waveguide or coupler is illustrated in FIGS. 4A-D, transmission media 400 is utilized to carry optical energy stored in the micro-cavity. Active media, which are excited by optical pumps can also be associated with the micro-cavities to facilitate the lasing of a signal within a frequency band of interest. In one embodiment, the transmission media 400 is a fiber waveguide, preferably a tapered waveguide as shown in FIG. 4A, although other fiber configurations can also be utilized.

The tapered sections 402 and 404 and the intermediate waist region 406 of the waveguide 400 may be provided, as is known, by stretching a fiber (e.g., a single mode fiber) under controllable tension as it is softened by one or more fixed or movable heat sources (e.g., torches). The ultra-high Q micro-cavity 100 is coupled to the externally guided power about the waist region 406 of the fiber 400. Commercially available machines can be used for this purpose in production environments. Taper waist 406 diameters are typically several microns, preferably about two microns. The diameter of the waist region can be adjusted to properly phase-match to the ultra-high Q micro-cavity resonator. Other discussions and details of such taper couplings can be found in U.S. application Ser. No. 09/454,719, entitled "Resonant Optical Wave Power Controlled Devices and Methods," filed Dec. 7, 1999, the disclosure of which is incorporated by reference herein.

The consequent reduction in diameter of about one or more orders of magnitude reduces the central core in the core/cladding structure of the optical fiber to vestigial size and function. As a result, the core no longer propagates a majority of the wave energy. Instead, without significant loss, the wave power in the full diameter fiber transitions into the waist region, where power is confined both within the attenuated cladding material and within a field emanating into the surrounding environment. After propagating through the waist region 406, exterior wave power is recaptured in the diverging tapered region and is again propagated with low loss within the outgoing fiber section 410.

Figure 4B:
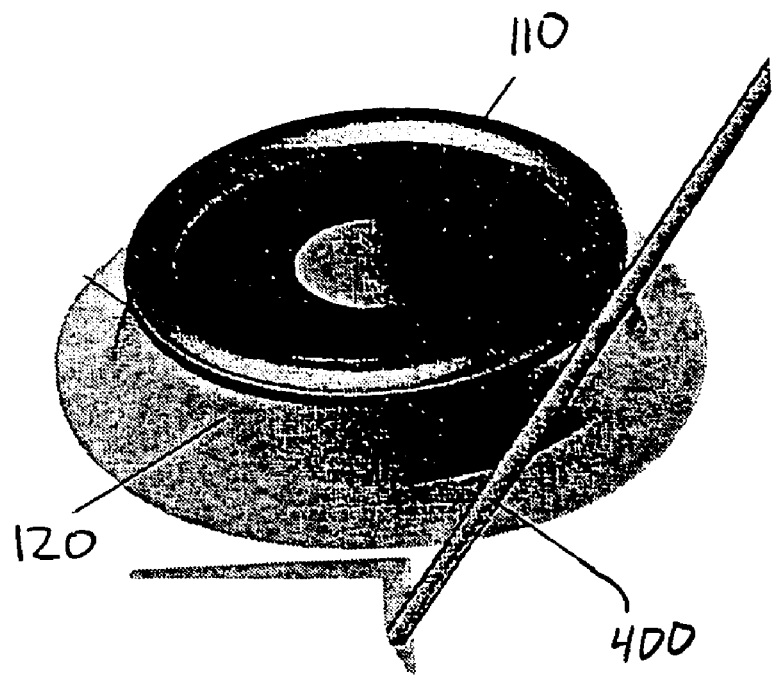
FIG. 4B is a perspective view of a fiber-taper waveguide coupled to a micro-cavity.
Figure 4C:
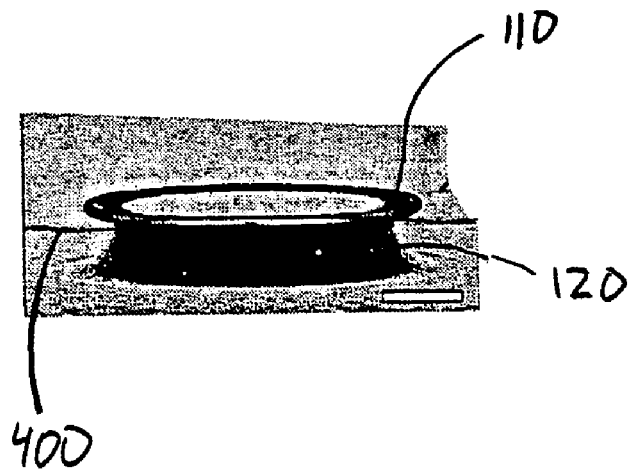
FIG. 4C is a side view of a fiber-taper waveguide coupled to a micro-cavity.
Figure 4D:
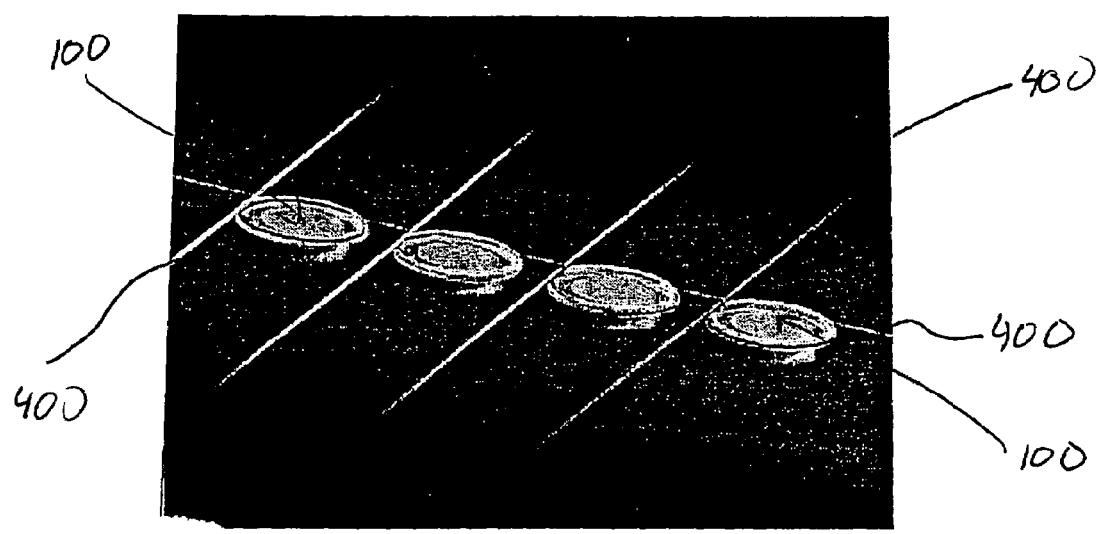
FIG. 4D is a perspective view of plurality of micro-cavities coupled to tapered fiber-taper waveguides.

An optical pump 420 is optically connected to a first end 412 of the fiber. The optical pump 420 transmits a signal along the waveguide and to the ultra-high Q micro-cavity resonator through the fiber taper. One or more excited laser signals in the ultra-high Q micro-cavity resonator are then communicated to the fiber waveguide. The resonator recirculates the energy with low loss in, for example, a whispering gallery mode (WGM), or other resonant mode, returning a part of the power to the waveguide at the waist. When a resonance exists at the chosen wavelength, the ultra-high Q micro-cavity functions with effectively total internal reflection and with minimal internal attenuation and radiative losses. However, the emanating portion of the wave power is still confined and guided, so it is presented for coupling back into the waveguide waist. These fiber coupling techniques can be used to couple a single tapered fiber to a single ultra-high Q micro-resonator, as shown in FIGS. 4B and 4C. Alternatively, a plurality of tapered fibers can be coupled to a plurality of micro-resonators, for example, as part of a circuit or to integrate with other components, as shown in FIG. 4D.

In one study, the mode structure and Q factor of toroid-shaped micro-cavities were characterized in an optical telecommunication band (1500 nm band). Tapered optical fibers (as previously discussed) were coupled to a single-mode, tunable, external-cavity laser to efficiently excite whispering gallery modes of the ultra-high Q micro-cavities. Tapered waveguides were positioned on a 20 nm resolution stage and could be moved freely over the sample to individually couple to each of the toroid-shaped micro-resonators. Dual microscopes were used to simultaneously image the micro-cavities and fiber tapers from the side and the top. In order to achieve proper alignment, the taper axis was adjusted to reside in the equatorial plane of the toroidal micro-cavity with minimal tilt angle. Critical coupling or the resonant transfer of all optical waveguide power into the resonator, was achieved by adjusting the gap between the taper and the micro-cavity. Low non-resonant losses were observed (e.g., <5%).

Figure 5A:
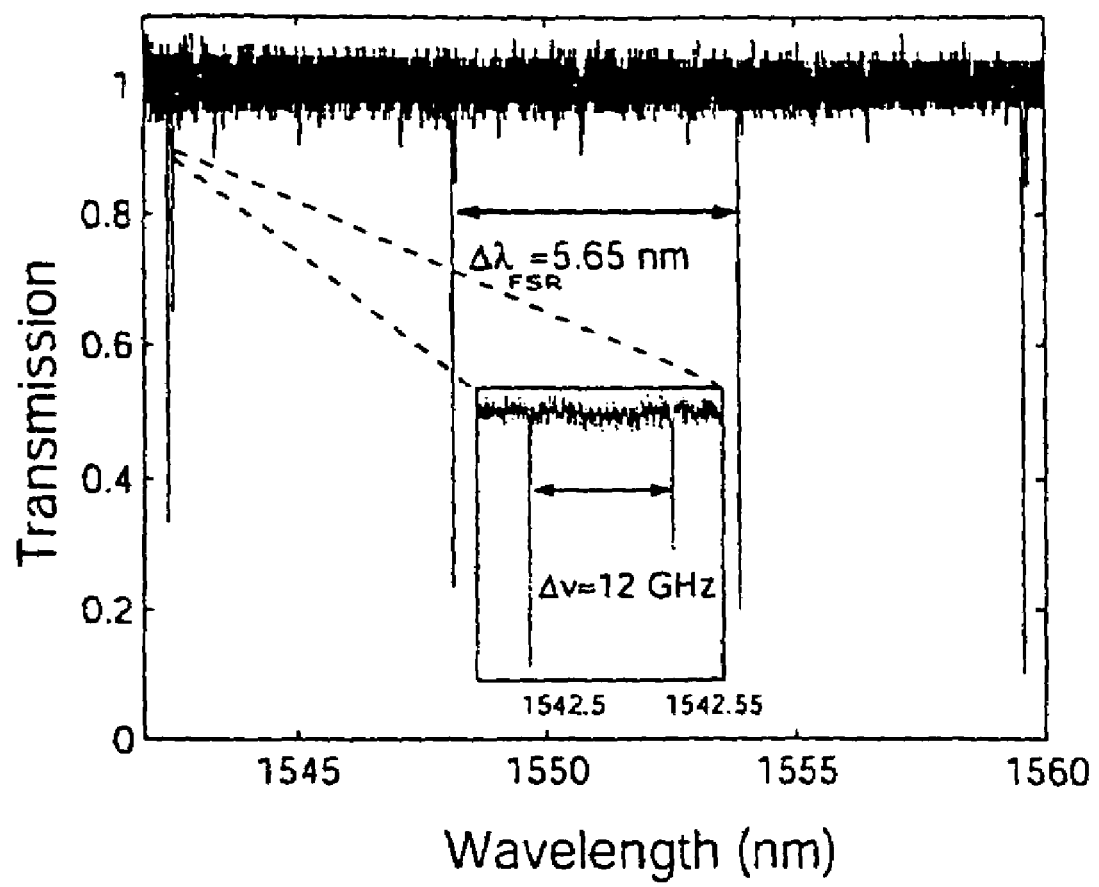
FIG. 5A is a graph illustrating transmission spectra and free spectral range of a micro-cavity.
Figure 5B:
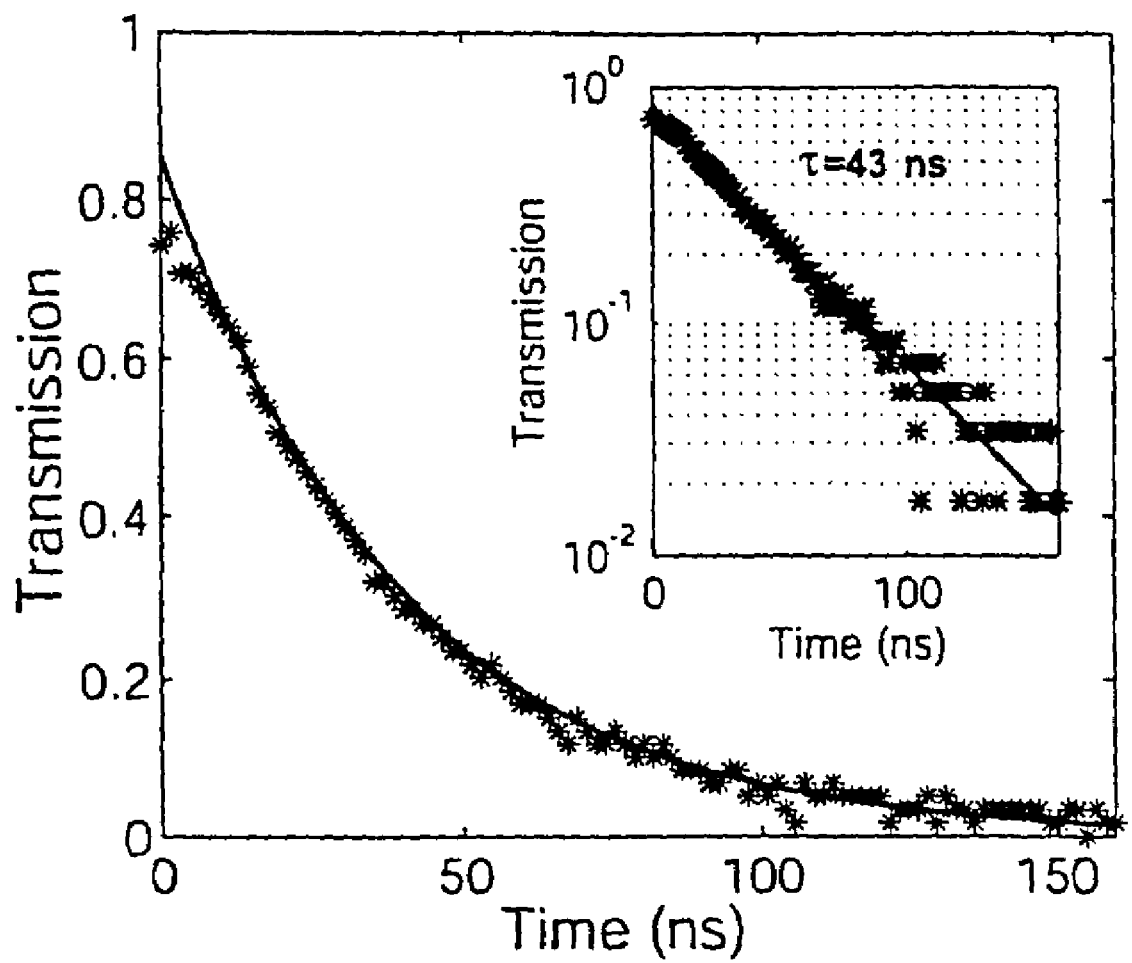
FIG. 5B is a graph illustrating a ringdown measurement of a micro-cavity.

FIGS. 5A and 5B illustrate graphs showing optical characteristics of two ultra-high Q micro-cavities according to the present invention. FIG. 5A shows the transmission spectra through a taper in close proximity (on the order of hundreds of nanometers) to a 94 μm diameter toroidal micro-cavity according to the present invention. The observed free spectral range (FSR) corresponds to the equatorial mode number (1-index, which in this case is >270). The micro-cavity having a FSR of about 1 nm to about 100 nm. As shown in the inset of FIG. 5A, the micro-cavity also supports at least two azimuthal (m-index or transverse) modes. The micro-cavity can also be configured to have differential azimuthal modes of about 12 GHz. Alternatively, the micro-cavity can be configured to have a single radially and transversly supported mode.

The Q factor of the micro-cavities was measured in two ways. First, the full-width half-maximum of the Lorentzian-shaped resonance in the undercoupled regime was directly measured by scanning a single-mode laser (short-term linewidth about 300 kHz) through a resonance. Low input power levels (typically less than 5 microwatts) were used to avoid thermally-induced distortion of the line shape due to resonant-field buildup within the cavity. Repeated measurements on samples fabricated with various radii (80-120 micron) and tori thickness (5-10 micron) yielded Q values in excess of 100 million ($10^8$), whereas previous known planar microresonators fabricated by wafer-scale processing typically have Q values as much as four orders of magnitude lower.

Referring to FIG. 5B, data from a typical ringdown measurement is provided for a micro-cavity according to the present invention having a diameter of about 90 μm. As an independent and more precise measurement of the Q factor, the photon lifetime was directly measured by cavity ringdown. In particular, ringdown measurements are immune to the thermal effects described above. This was done by repeatedly scanning the laser into resonance with a mode that was critically coupled to the taper. As the laser scanned into resonance, power transfer increased until maximal "charging" of the resonant mode was attained. At this moment, the laser input was gated "off" by use of a high-speed, external modulator and cavity ringdown is observed as the resonant power discharges. Because the micro-cavity is by necessity loaded during this measurement, the observed ringdown time yields the loaded Q-factor at the critical point (not the intrinsic Q).

At time t=0 in FIG. 5B, a signal is applied to "gate" the laser off. When the laser input is fully off, the detected power is due entirely to the cavity discharge field. The solid line represents an exponential fit as expected for decay of a single cavity mode. The inset shows a logarithmic plot to infer the cavity lifetime. The loaded lifetime in this structure was 43 ns. As a further check on this time constant, after gating of the pump laser the waveguide power has dropped to 80% of its predicted maximal value based on extrapolation of data to t=0. This value is consistent with the gating delay of the ringdown setup (approximately 8 ns). In particular, using the observed mode-lifetime of τ=43 ns yields $e^{31 \, \Delta T/\tau} \approx .83$.

Loading by the taper waveguide and the excitation of the counter-propagating mode due to scattering centers intrinsic to the resonator (described by a dimensionless intermode coupling parameter F) are accounted for when inferring the intrinsic cavity Q value. The techniques used to measure this parameter in ultra-high-Q taper-coupled resonators are described in various references.

For the mode shown in FIG. 5B, the intermode coupling was measured to be approximately 1, giving rise to a weak counter-propagating wave excitation (17% of the cavity buildup field is stored in the counter-propagating mode at critical coupling). In the presence of intermode coupling the relationship between the critically-coupled and the intrinsic (unloaded) cavity Q becomes, $Q_0 = \omega \tau_0 = \omega \tau_{crit}(1+\sqrt{1+\Gamma^2})$ This yields an intrinsic cavity Q of $1.25 \times 10^8$ inferred from cavity ringdown. This value is consistent with the measurements of the frequency line shape described above.

In yet a further alternative embodiment, the silica ring can have a treated surface (such as a biotinlynated surface), a dopant or an embedded active optical component that may alter or functionalize the operation of an ultra-high Q micro-cavity resonator. For example, in one embodiment, the silica ring is doped with erbium. In a further alternative embodiment, the silica ring includes an embedded active component, such as erbium. Persons of ordinary skill in the art will recognize that other dopants and components can be utilized depending on the desired micro-cavity characteristics and functions. The ultra-high Q micro-cavity can also include a coating, such as a chemical or biologically active substance, to functionalize the micro-cavity surface.

Figure 6:
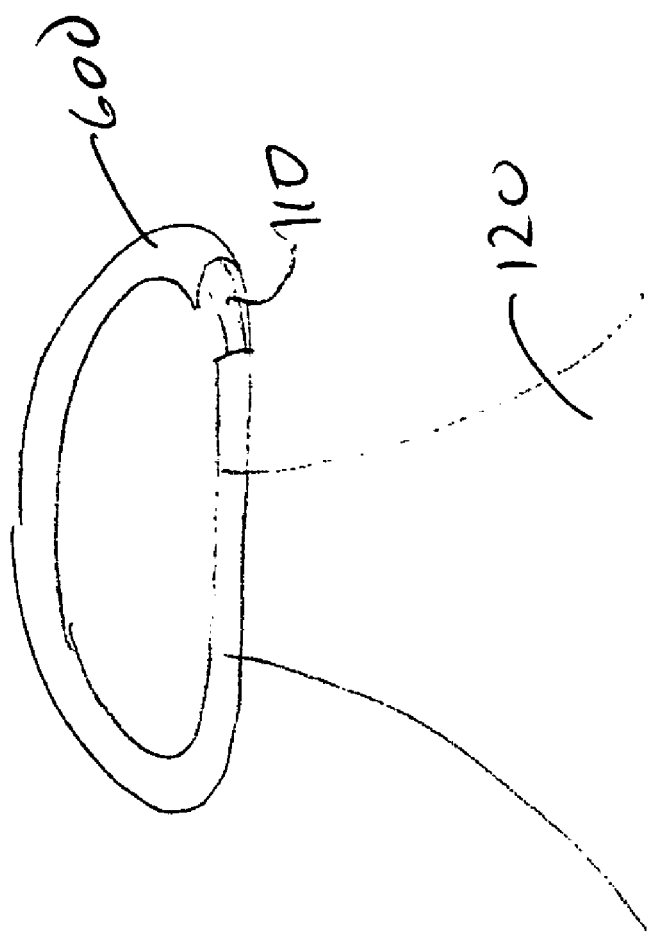
FIG. 6 is a perspective view of a micro-cavity that is coated with a sol-gel film.

In one embodiment, as shown in FIG. 6, the ultra-high Q micro-cavity is coated with an doped sol-gel film 600, such as an erbium-doped sol-gel film. Sol-gel is a colloidal suspension of silica particles that is gelled to form a solid. Various commercially available sol-gel films can be doped with erbium. The Er+3 concentration in the sol-gel layer can be from about $0.1 \times 10^{16}$ to about $10^{20}$, preferably about $10^{19}$ $cm^3$. Other characteristics and technical aspects of a suitable sol-gel film are described in "Gain Functionalization of Silica Microresonators," Optics Letters, vol. 28, no. 8, pp. 592-594 (Apr. 15, 2003), the disclosure of which is incorporated herein by reference.

In one implementation, the silica micro-cavities are immersed in the sol-gel solution for about three to five hours, and then heated at about 160° C. for about 10 hours. The micro-cavities are then irradiated with a $CO_2$ laser, again at about 10.6 micrometers, in order to reflow and densify the sol-gel film. As a result of the laser radiation, the sol-gel is selectively reflowed and densified at the periphery of the micro-cavity. Referring to FIGS. 7A-B, a fiber-taper waveguide 700 can be coupled to the coated ultra-high Q micro-resonator, as previously described.

Figure 8B:
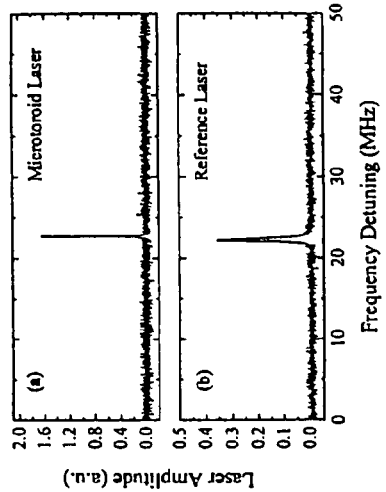
FIG. 8B is a graph comparing a reference laser with the output of an erbium-doped sol-gel coated micro-cavity and FIG. 8C is a graph illustrating laser output power versus absorbed pump power.
Figure 8A:
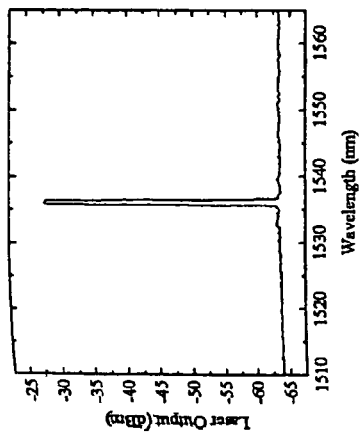
FIG. 8A is a graph illustrating laser emission spectrum and output power from an erbium-doped sol-gel coated micro-cavity.
Figure 8C:
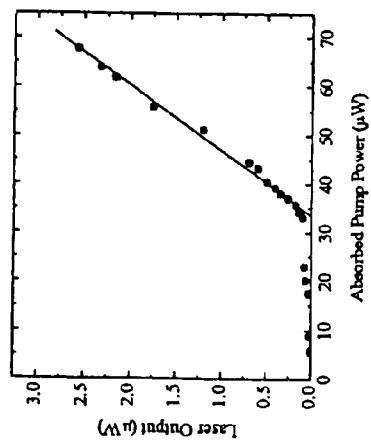

FIGS. 8A-C illustrate the optical characteristics of a toroid micro-resonator that includes an erbium-doped sol gel coating prepared and applied according to the previously described method. Specifically, FIG. 8A is a graph that illustrates the emission spectrum of the sol-gel coated micro-resonator that is measured utilizing a high finesse scanning Fabry-Perot spectrometer. FIG. 8B shows the spectra of a reference laser emission spectrum from a 1550 nm single mode laser with short term linewidth of 300 kHz and the emission of the erbium-doped sol-gel coated micro-cavity. FIG. 8C illustrates the measured laser output versus the absorbed pump power for a micro-resonator having a diameter of about 80 micrometers. Other characteristics and technical aspects of an erbium-doped sol-gel coating suitable for use in the present invention are described in "Fiber-coupled Erbium Microlasers on a Chip," Applied Physics Letters, Vol. 83, Number 5, p. 825 (Aug. 4, 2003), the disclosure of which is incorporated herein by reference.

The previously described embodiments of an ultra-high-Q planar micro-resonator can be fabricated on a chip, such as a silicon chip, or other suitable substrates. The combination of the planar configuration of the micro-cavity and ultra-high Q values enables these devices to be efficiently and consistently processed with know wafer processing techniques. Further, the large transparency window of silica enable these devices to be utilized in various photonics applications, as well as in fundamental studies. Doping and coating an ultra-high Q provides further enhancements. Electrical functionality can also be introduced to integrate control functions with the ultra-high-Q micro-cavities. For example, the ultra-high Q micro-cavity can serve as atomic traps on a chip for chip-scale integration of cQED experiments and related devices.

The ultra-high Q micro-resonators of the present invention are flexible and adaptable for use in various applications. For example, the resonators can be used in telecommunications and environmental/chemical/biological sensing system, particularly sensing applications that require the high degree of sensitivity provided by the ultra-high Q micro-resonators of the present invention. Although references have been made in the foregoing description to various embodiments, persons of ordinary skill in the art will recognize that insubstantial modifications, alterations, and substitutions can be made to the described embodiments without departing from the invention as recited in the accompanying claims. For example, other optical materials besides silica can be utilized, and other substrates besides silicon may be suitable depending on the particular application of the device or integration and coupling considerations. Moreover, various sizes and shapes of ultra-high Q micro-cavities can be adjusted to used, and coatings and other devices can be used to functionalize the ultra-high Q micro-resonator.

What is claimed:

1. An ultra-high Q micro-cavity resonator, comprising:
   an ultra-high Q micro-cavity having a Q value of at least $1.00 \times 10^8$, the micro-cavity being planar; and
   a substrate,
   portions of the substrate located below the ultra-high Q micro-cavity being removed to form a pillar, the pillar supporting the ultra-high Q micro-cavity, whereby optical energy travels along an inner surface of the ultra-high Q micro-cavity.

2. The resonator of claim 1, the micro-cavity comprising an ultra-high Q silica micro-cavity.

3. The resonator of claim 1, the micro-cavity being substantially circular and having a diameter of about 10 micrometers to about 500 micrometers.

4. The resonator of claim 1, the micro-cavity having a toroid shape.

5. The resonator of claim 4, the toroid-shaped micro-cavity having a thickness of about five to about ten micrometers.

6. The resonator of claim 1, the micro-cavity having an elliptical shape.

7. The resonator of claim 1, the micro-cavity being substantially parallel to a top surface of the pillar.

8. The resonator of claim 1, the micro-cavity having a Q value of about $10^8$ to about $5 \times 10^8$.

9. The resonator of claim 1, the micro-cavity having a diameter of about 10 micrometers to about 30 micrometers and a Q value of about 500 million.

10. The resonator of claim 1, the micro-cavity comprising a glass material having a melting point that is lower than a melting point of the substrate.

11. The resonator of claim 1, a resonant mode within the micro-cavity comprising a whispering-gallery mode (WGM).

12. The resonator of claim 1, the substrate comprising a silicon substrate.

13. The resonator of claim 1, the substrate underneath the micro-cavity being removed by an etchant.

14. The resonator of claim 13, the etchant comprising a xenon difluoride ($XeF_2$) gas.

15. The resonator of claim 14, wherein the $XeF_2$ gas isotropically etches the substrate beneath a periphery of the micro-cavity to form the pillar.

16. The resonator of claim 15, the substrate comprising a silicon substrate.

17. The resonator of claim 1, the pillar having a tapered shape.

18. The resonator of claim 1, the micro-cavity including a rare earth dopant.

19. The resonator of claim 18, the rare Earth dopant being erbium, ytterbium, or neodymium.

20. The resonator of claim 1, the micro-cavity including an optically active component.

21. The resonator of claim 1, the micro-cavity comprising a silica ultra-high Q micro-cavity, and the substrate comprising a silicon substrate.

22. The ultra-high Q micro-cavity resonator of claim 1 having a root mean square (rms) roughness of several nanometers.

23. An ultra-high Q micro-cavity resonator, comprising:
   an optical material; and
   a substrate that supports the optical material, wherein
      the optical material is meltable by heat so that a periphery of the optical material adheres to itself to form an ultra-high Q micro-cavity having a Q value of at least $1.00 \times 10^8$,
      the micro-cavity is planar, and
      optical energy travels along an inner surface of the ultra-high Q micro-cavity.

24. The resonator of claim 23, the optical material comprising silica.

25. The resonator of claim 23, the optical material comprising a glass material having a melting point that is lower than a melting point of the substrate.

26. The resonator of claim 23, the optical material comprising a disk, wherein a diameter of the optical material becomes smaller when heated to form a disk.

27. The resonator of claim 26, wherein the diameter decreases until the molten optical material collapses after which the diameter remains substantially constant.

28. The resonator of claim 23, the ultra-high Q micro-cavity comprising an ultra-high Q silica micro-cavity.

29. The resonator of claim 23, the ultra-high Q micro-cavity being substantially circular and having a diameter of about 10 micrometers to about 500 micrometers 30. The resonator of claim 23, the ultra-high 0 micro-cavity having a toroid shape.

31. The resonator of claim 30, the toroid having a thickness of about five to about ten micrometers.

32. The resonator of claim 23, the ultra-high Q micro-resonator having an elliptical shape.

33. The resonator of claim 23, the ultra-high Q micro-cavity being substantially parallel to a top surface of the pillar.

34. The resonator of claim 23, wherein a size of the ultra-high Q micro-cavity is limited by a size of a top surface of the substrate.

35. The resonator of claim 23, the ultra-high Q micro-cavity having a Q value of about $10^8$ to about $5 \times 10^8$.

36. The resonator of claim 23, the ultra-high Q micro-cavity having a diameter of about 10 micrometers to about 30 micrometers and a Q value of about 500 million.

37. The resonator of claim 23, a resonant mode within the ultra-high Q micro-cavity being a whispering-gallery mode (WGM).

38. The resonator of claim 23, the substrate comprising a silicon substrate.

39. The resonator of claim 23, wherein portions of the substrate located below the ultra-high Q micro-cavity are removed to form a pillar, the pillar supporting the ultra-high Q micro-cavity.

40. The resonator of claim 39, the pillar having a tapered shape.

41. The resonator of claim 23, the substrate underneath the periphery of the ultra-high Q micro-cavity being removed by an etchant.

42. The resonator of claim 41, the etchant comprising xenon difluoride ($XeF_2$) gas.

43. The resonator of claim 42, wherein the $XeF_2$ gas isotropically etches the substrate beneath the periphery of the micro-cavity.

44. The resonator of claim 23, the heat source comprising an Excimer laser.

45. The resonator of claim 44, wherein the Excimer laser heats and liquefies the optical material.

46. The resonator of claim 23, the heat source comprising a $CO_2$ laser.

47. The resonator of claim 46, wherein the $CO_2$ laser emits radiation having a wavelength of about 10.6 micrometers.

48. The resonator of claim 46, wherein the $CO_2$ laser heats the optical material for about 1 microsecond to about 10 seconds.

49. The resonator of claim 46, wherein the $CO_2$ laser heats and liquefies the optical material.

50. The resonator of claim 23, wherein the optical material comprises silica and the substrate comprises silicon.

51. The resonator of claim 23, the ultra-high Q micro-cavity including a dopant.

52. The resonator of claim 51, the dopant being erbium, ytterbium, or neodymium.

53. The resonator of claim 23, the ultra-high Q micro-cavity including an optically active component.

54. The ultra-high Q micro-cavity resonator of claim 23 having a root mean square (rms) roughness of several nanometers.

55. A planar micro-cavity resonator, comprising:
an ultra-high Q toroid-shaped planar silica micro-cavity having a Q value of at least $1.00 \times 10^8$; and
a silicon substrate;
wherein portions of the silicon substrate located below a periphery of the ultra high-Q toroid-shaped planar silica micro-cavity are isotropically etched to form a silicon pillar, the silicon pillar supporting the ultra-high Q toroid-shaped planar silica micro-cavity, and wherein light energy traverses along an inner surface of the ultra-high Q toroid-shaped planar micro-cavity.

56. A micro-cavity resonator, comprising:
an ultra-high Q micro-cavity having a Q value of at least $1.00 \times 10^8$ and having a biotinylated surface, the micro-cavity beinci planar; and
a substrate, portions of the substrate located below the ultra-high micro-cavity being removed to form a pillar that supports the ultra-high Q micro-cavity, whereby optical energy travels along an inner surface of the micro-cavity.

57. An ultra-high Q micro-cavity resonator, comprising:
an optical material; and
a substrate that supports the optical material, wherein
the optical material is meltable by a heat source so that a periphery of the optical material adheres to itself to form an ultra-high Q micro-cavity, the ultra-high Q micro-cavity having a Q value of at least $1.00 \times 10^8$ and having a biotinylated surface,
the micro-cavity is planar, and
optical energy travels along an inner surface of the ultra-high Q micro-cavity.

* * * * *